(12) United States Patent
Park et al.

(10) Patent No.: US 11,532,804 B2
(45) Date of Patent: Dec. 20, 2022

(54) METHOD OF MANUFACTURING FLEXIBLE OLED MODULE

(71) Applicants: BSP CO., LTD., Anyang-si (KR); JOONGWOO M-TECH CO., LTD., Ansan-si (KR)

(72) Inventors: Hong Jin Park, Anyang-si (KR); Sung Soo Park, Yongin-si (KR)

(73) Assignees: BSP CO., LTD., Anyang-si (KR); JOONGWOO M-TECH CO., LTD., Ansan-si (KR)

( * ) Notice: Subject to any disclaimer, the term of this patent is extended or adjusted under 35 U.S.C. 154(b) by 183 days.

(21) Appl. No.: 17/068,837

(22) Filed: Oct. 13, 2020

(65) Prior Publication Data

US 2021/0143372 A1 May 13, 2021

(30) Foreign Application Priority Data

Nov. 13, 2019 (KR) .................. 10-2019-0145041

(51) Int. Cl.
*H01L 51/56* (2006.01)
*H01L 51/52* (2006.01)
*H01L 51/00* (2006.01)

(52) U.S. Cl.
CPC .......... *H01L 51/56* (2013.01); *H01L 51/0097* (2013.01); *H01L 51/5253* (2013.01); *H01L 2251/566* (2013.01)

(58) Field of Classification Search
None
See application file for complete search history.

(56) References Cited

U.S. PATENT DOCUMENTS

| 2016/0118448 | A1* | 4/2016 | Epstein | H01L 51/5271 257/40 |
| 2019/0333425 | A1* | 10/2019 | Yasuda | H01L 27/1266 |
| 2021/0074876 | A1* | 3/2021 | Kishimoto | H01L 33/0093 |
| 2021/0376302 | A1* | 12/2021 | Tanaka | H01L 51/0097 |

FOREIGN PATENT DOCUMENTS

| KR | 10-2006-0112660 A | 11/2006 |
| KR | 10-2018-0048891 A | 5/2018 |
| KR | 10-2018-0052797 A | 5/2018 |

* cited by examiner

*Primary Examiner* — J. E. Schoenholtz
(74) *Attorney, Agent, or Firm* — Revolution IP, PLLC

(57) ABSTRACT

A method of manufacturing a flexible OLED module includes: forming a polymer layer on one surface of a base substrate; forming a thin glass sheet on one surface of the polymer layer; forming multiple OLED elements on one surface of the thin glass sheet; forming a protective layer on one surface of the thin glass sheet to cover the OLED elements; separating the base substrate and the polymer layer from each other through separation of the sacrificial layer by laser lift-off (LLO); and cutting the thin glass sheet and the protective layer to provide multiple unit OLED modules each including the OLED element.

7 Claims, 6 Drawing Sheets

(a)   (b)

(a)

(b)

METHOD OF MANUFACTURING FLEXIBLE OLED MODULE

FIELD

The present invention relates to a method of manufacturing a flexible OLED module, and more particularly, to a method of manufacturing a flexible OLED module that can effectively prevent infiltration of moisture or oxygen.

BACKGROUND

A flexible OLED module including organic light emitting diodes (OLEDs) includes a coating film for shielding infiltration of oxygen, which negatively influences the OLEDs.

Typically, such a coating film is formed of a flexible polyimide (PI) resin. However, since such a PI coating film can fail to effectively shield infiltration of moisture or oxygen, the flexible OLED module is further provided with a barrier film that can assist in shielding infiltration of moisture or oxygen.

However, when particles enter the barrier film or a gap between the barrier film and the PI coating film in the course of coating or attaching the barrier film, the flexible OLED module becomes defective, thereby causing reduction in yield. Moreover, when the barrier film has a defect in the course of coating or attaching the barrier film, moisture or oxygen can enter the barrier film through the defect, causing deterioration in reliability of the flexible OLED module.

SUMMARY

Embodiments of the present invention have been conceived to solve such a problem in the art and it is an aspect of the present invention to provide a method of manufacturing a flexible OLED module that can effectively prevent infiltration of moisture or oxygen.

The above and other aspects of the present invention will become apparent to those skilled in the art from the detailed description of the following embodiments in conjunction with the accompanying drawings.

In accordance with an aspect of the present invention, a method of manufacturing a flexible OLED module includes: a polymer layer formation step in which a polymer layer is formed on one surface of a base substrate; a thin glass sheet formation step in which a thin glass sheet is formed on one surface of the polymer layer; an OLED element formation step in which multiple OLED elements are formed on one surface of the thin glass sheet; a protective layer formation step in which a protective layer is formed on one surface of the thin glass sheet to cover the OLED elements; a separation step in which the base substrate is separated from the polymer layer through separation of the sacrificial layer by laser lift-off (LLO); and a singulation step in which the thin glass sheet and the protective layer are cut to provide multiple unit OLED modules each including the OLED element.

In one embodiment, in the polymer layer formation step, the polymer layer may be formed in a region excluding a cutting-scheduled line along which cutting will be performed in the singulation step.

In one embodiment, in the polymer layer formation step, the polymer layer may be formed in a region excluding a hole region corresponding to a hole for an electronic device to be assembled to the unit OLED.

In one embodiment, the method may further include an anti-etching layer formation step in which an anti-etching layer is formed on one surface of the protective layer, after the protective layer formation step, wherein the singulation step may include a deformation line generation step in which a glass deformation line is generated on the thin glass sheet by irradiating a cutting-scheduled line on the thin glass sheet with an intensity of laser beams not exceeding an ablation threshold of the thin glass sheet, and an etching step in which the thin glass sheet and the protective layer are removed along the glass deformation line by removing the glass deformation line through etching with an etchant while allowing the protective layer exposed through the removed glass deformation line to be removed through etching with the etchant.

In one embodiment, in the deformation line generation step, a phase of the glass deformation line may be changed from an alpha phase ($\alpha$ phase) to a beta phase ($\beta$ phase).

In one embodiment, in the deformation line generation step, the phase of the glass deformation line may be changed by irradiating the cutting-scheduled line with the laser beams from one surface of the thin glass sheet to the other surface thereof while focusing the laser beams at a single focus on the thin glass sheet.

In one embodiment, in the deformation line generation step, the phase of the glass deformation line may be changed by irradiating the cutting-scheduled line with the laser beams from one surface of the thin glass sheet to the other surface thereof while consecutively moving a focus of the laser beams.

In one embodiment, the thin glass sheet may have a thickness of greater than 0 μm to 100 μm.

In one embodiment, the method may further include a sacrificial layer formation step in which a sacrificial layer is formed on one surface of the base substrate such that the polymer layer is formed on one surface of the sacrificial layer, before the polymer layer formation step, wherein, in the separation step, the base substrate and the polymer layer may be separated from each other through separation of the sacrificial layer by laser lift-off.

According to the embodiments of the invention, the polymer layer may be disposed in a region excluding a cutting-scheduled line along which cutting will be performed in the singulation step and in a region excluding a hole region corresponding to holes exposing some components of an electronic device such that the OLED module can be assembled to the electronic device therethrough. As a result, a process for removing the polymer layer blocking the cutting-scheduled line and the hole region can be omitted.

Further, according to the embodiments of the invention, since the thin glass sheet is formed on one surface of the polymer layer, the polymer layer can prevent broken fragments of the thin glass sheet from scattering even in the event of breakage of the thin glass sheet during the process. Furthermore, even when the polymer layer has defects such as pinholes, the thin glass sheet can block infiltration of moisture or oxygen through the pinholes.

Furthermore, according to the embodiments of the invention, the phase of the thin glass sheet is changed from the alpha phase to the beta phase through irradiation of some portions of the thin glass sheet with laser beams and the portions of the thin glass sheet subjected to phase conversion is removed through etching, thereby providing a clean cut surface.

It will be understood that advantageous effects of the present invention are not limited to the above and include

DRAWINGS

DETAILED DESCRIPTION

Figure 1:
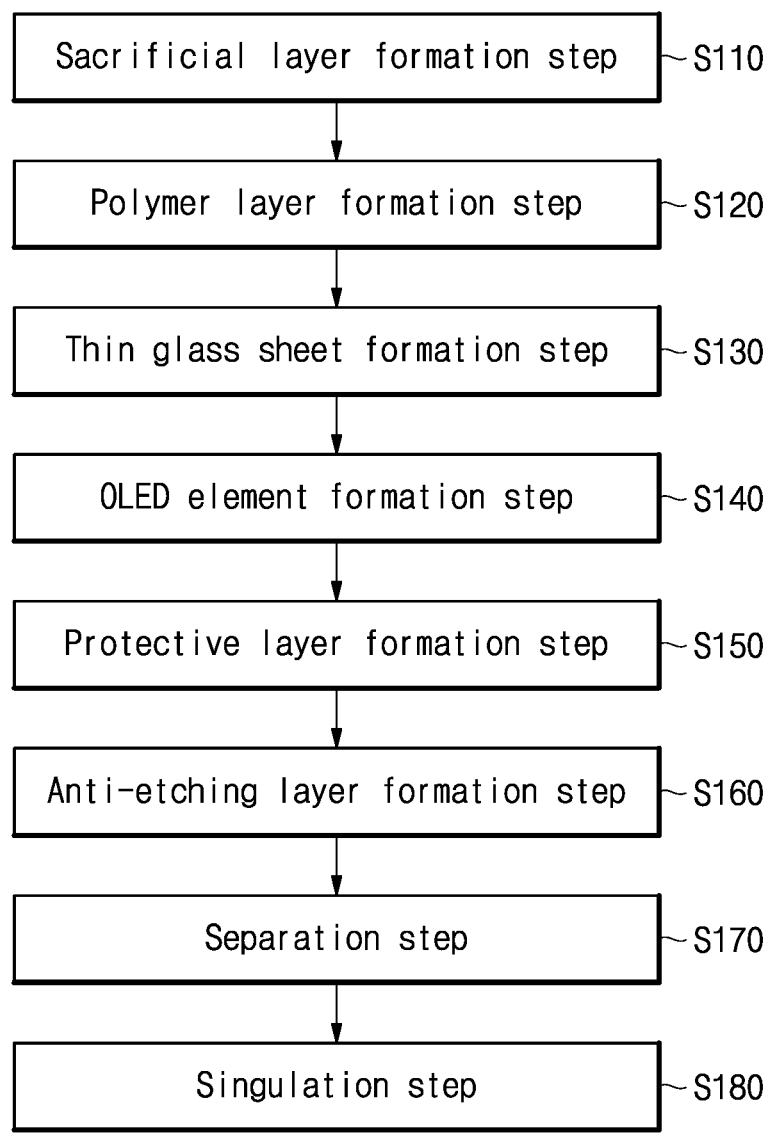
FIG. 1 and FIG. 2 are flowcharts illustrating a method of manufacturing a flexible OLED module according to one embodiment of the present invention.

Hereinafter, embodiments of the present invention will be described with reference to the accompanying drawings. It should be understood that the present invention may be embodied in different ways and is not limited to the following embodiments. In the drawings, portions irrelevant to the description will be omitted for clarity and like components will be denoted by like reference numerals throughout the specification.

Throughout the specification, when an element or layer is referred to as being "on," "connected to," or "coupled to" another element or layer, it may be directly on, connected to, or coupled to the other element or layer or intervening elements or layers may be present. In addition, unless stated otherwise, the term "includes" should be interpreted as not excluding the presence of other components than those listed herein.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described in detail with reference to the accompanying drawings.

Figure 2:
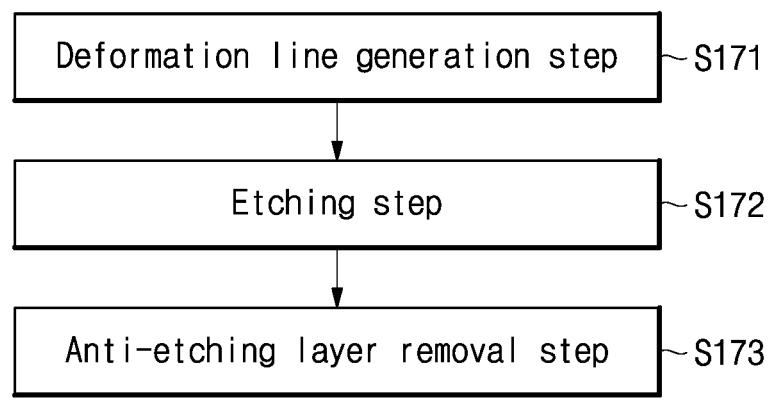
Figure 3:
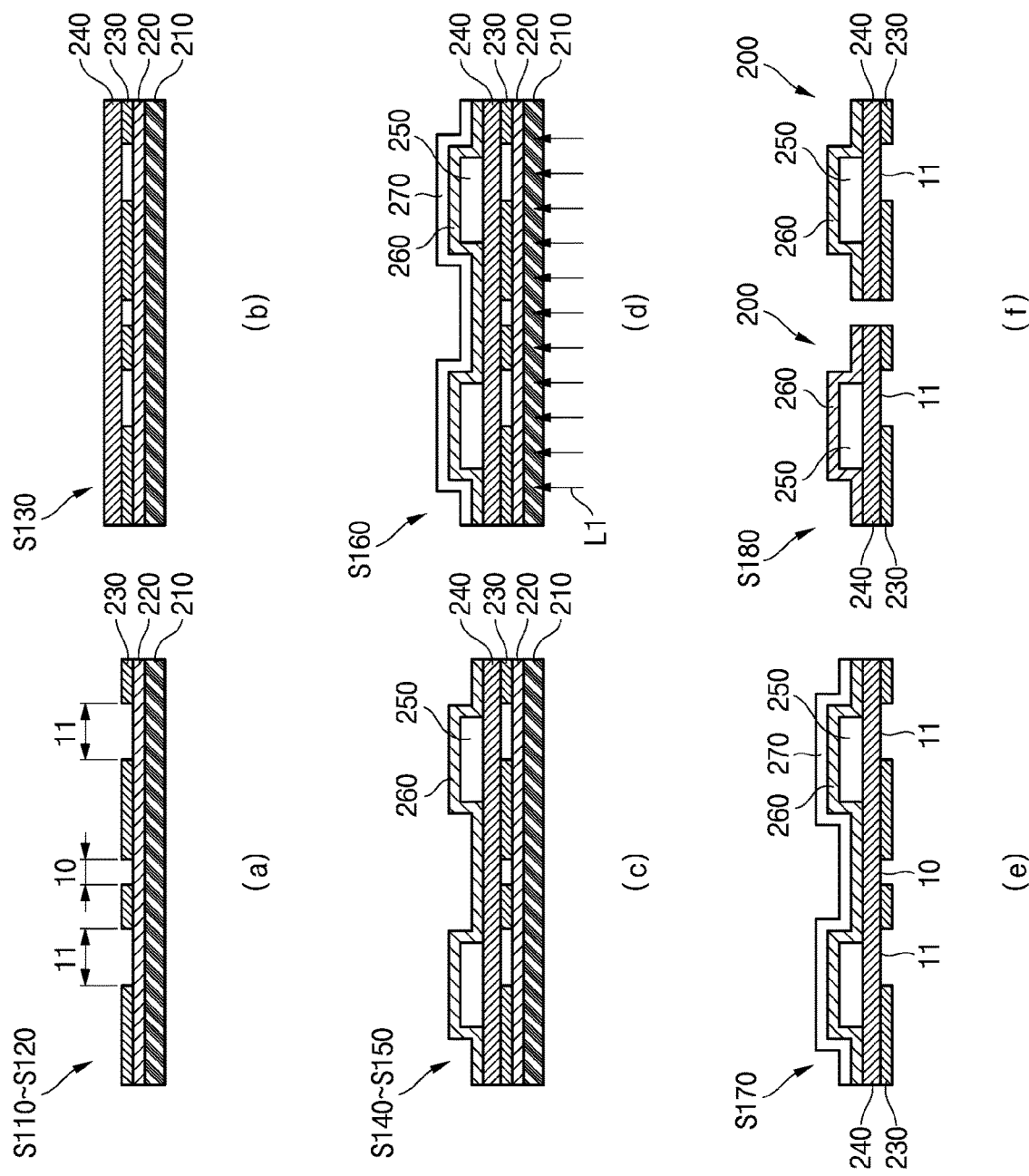
FIG. 3 is a flow diagram illustrating the method of manufacturing a flexible OLED module shown in FIG. 1.

FIG. 1 and FIG. 2 are flowcharts illustrating a method of manufacturing a flexible OLED module according to one embodiment of the present invention. FIG. 3 is a flow diagram illustrating the method of manufacturing a flexible OLED module shown in FIG. 1 and FIG. 4 is a plan view of FIG. 3 (a).

Figure 4:
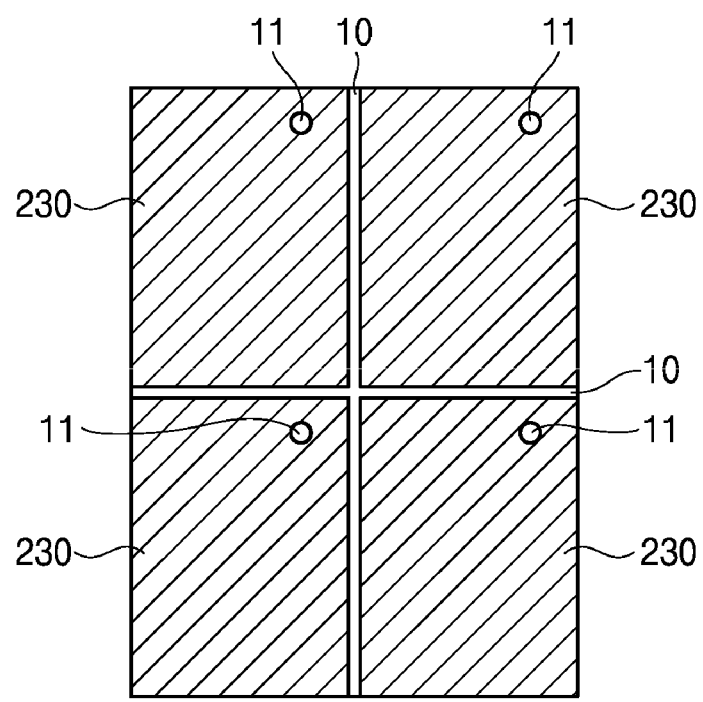
FIG. 4 is a plan view of FIG. 3 (a).

First, as shown in FIG. 1, FIG. 3 and FIG. 4, the method of manufacturing a flexible OLED module according to the embodiment may include a polymer layer formation step S120, a thin glass sheet formation step S130, an OLED element formation step S140, a protective layer formation step S150, a separation step S170, and a singulation step S180.

In the polymer layer formation step S120, a polymer layer 230 may be formed on one surface of a base substrate 210.

The base substrate 210 may be a carrier glass substrate. In addition, the base substrate 210 may have a large area to allow fabrication of multiple flexible OLED modules at the same time by the manufacturing method according to the present invention.

The polymer layer 230 may be, for example, a polyimide layer, without being limited thereto. The polymer layer 230 may be formed by coating a liquid polymer on one surface of the base substrate 210, followed by curing the liquid polymer.

In the polymer layer formation step S120, the polymer layer 230 may be formed in a region excluding a cutting-scheduled line 10 along which cutting will be performed in the singulation step S180.

The manufacturing method according to the present invention is performed on the base substrate 210 having a large area, followed by performing the singulation step S180 to provide multiple unit OLED modules 200. The cutting-scheduled line 10 refers to a portion along which cutting is performed in the singulation step S180 and may correspond to the periphery of each of the unit OLED modules 200.

Further, in the polymer layer formation step S120, the polymer layer 230 may be formed in a region excluding a hole region 11 corresponding to holes that expose some components of an electronic device to be assembled to the unit OLED modules 200. Here, the components of the electronic device may include a camera, a speaker, an external connection terminal, and the like. If the polymer layer is disposed in the hole region 11, there is a need for a process for removing the polymer layer from the hole region 11. However, according to the present invention, since the polymer layer is not present in the hole region 11, it is possible to omit the process for removing the polymer layer that blocks the hole region 11. The polymer layer 230 may have a thickness of 10 μm or less.

The manufacturing method according to the present invention may further include a sacrificial layer formation step S110 before the polymer layer formation step S120.

In the sacrificial layer formation step S110, a sacrificial layer 220 may be formed on one surface of the base substrate 210. When the sacrificial layer 220 is formed thereon, the polymer layer 230 may be formed on one surface of the sacrificial layer 220. The polymer layer 230 may be formed by coating a liquid polymer on one surface of the sacrificial layer 220, followed by curing the liquid polymer.

When the sacrificial layer 220 is formed on the base substrate 210, the sacrificial layer 220 may be removed by laser beams L1 in the separation step S170 described below, thereby allowing a laser-lift off (LLO) process to be performed. The sacrificial layer 220 may be formed of any material known in the art without limitation.

In the thin glass sheet formation step S130, a thin glass sheet 240 may be formed on one surface of the polymer layer 230. The thin glass sheet 240 may be an ultra-thin glass sheet having a thickness of greater than 0 to 100 μm.

The process of curing the liquid polymer to form the polymer layer 230 may be carried out after attaching the thin glass sheet 240 to the liquid polymer coated on the base substrate or the sacrificial layer. Since the liquid polymer is bonded to the thin glass sheet 240 in the course of curing, bonding strength between the polymer layer 230 and the thin glass sheet 240 can be increased. The process of curing the liquid polymer may be carried out at a temperature of 350° C. to 400° C.

If the thin glass sheet 240 is directly formed on the base substrate 210 without the polymer layer, broken fragments of the thin glass sheet 240 can be scattered in the event of breakage of the thin glass sheet 240 during the process. However, according to the present invention, since the thin glass sheet 240 is formed on one surface of the polymer layer 230 to allow the broken fragments of the thin glass sheet 240 to remain in a state of being attached to the polymer layer 230 in the event of breakage of the thin glass sheet 240 during the process, scattering of the broken fragments can be prevented by the polymer layer 230.

Furthermore, even when the polymer layer 230 has defects such as pinholes, the thin glass sheet 240 can block infiltration of moisture or oxygen through the pinholes.

In the OLED element formation step S140, multiple OLED elements 250 are formed on one surface of the thin glass sheet 240. Here, the OLED elements 250 may be formed corresponding to the unit OLED modules 200, respectively.

If the OLED elements 250 are directly formed on the polymer layer 230 without the thin glass sheet 240, there is a need for a treatment process for preventing moisture or oxygen from entering the hole region 11 of the polymer layer 230. However, according to the present invention, since the thin glass sheet 240 is formed on one surface of the polymer layer 230 and the OLED elements 250 are formed on one surface of the thin glass sheet 240, it is possible to prevent infiltration of moisture or oxygen even without the treatment process for preventing moisture or oxygen from entering the hole region 11 of the polymer layer 230.

In the protective layer formation step S150, a protective layer 260 may be formed on one surface of the thin glass sheet 240 to cover the OLED elements 250. The protective layer 260 may be formed via thin-film encapsulation (TFE). The protective layer 260 covers the OLED elements 250 and is directly formed on one surface of the thin glass sheet 240, thereby more stably preventing infiltration of moisture or oxygen.

In the separation step S170, the base substrate 210 and the polymer layer 230 are separated from each other by irradiating a boundary between the base substrate 210 and the polymer layer 230 with laser beams.

Typically, when two glass substrates are attached to each other by static electricity, it is difficult to separate the two glass substrates from each other at a temperature of 350° C. or more. However, according to this embodiment, the polymer layer 230 is disposed between the base substrate 210 and the thin glass sheet 240, and the thin glass sheet 240 is separated from the polymer layer 230 by irradiating the boundary between the base substrate 210 and the polymer layer 230 with laser beams, thereby allowing the manufacturing process to be carried out at a temperature of 350° C. or more.

In the structure wherein the sacrificial layer 220 is further disposed between the base substrate 210 and the polymer layer 230, the base substrate 210 may be separated from the polymer layer 230 through separation of the sacrificial layer 220 by laser-lift off (LLO) in the separation step S170.

In the singulation step S180, the thin glass sheet 240 and the protective layer 260 may be cut to form multiple unit OLED modules 200 each including the OLED element 250.

Figure 5:
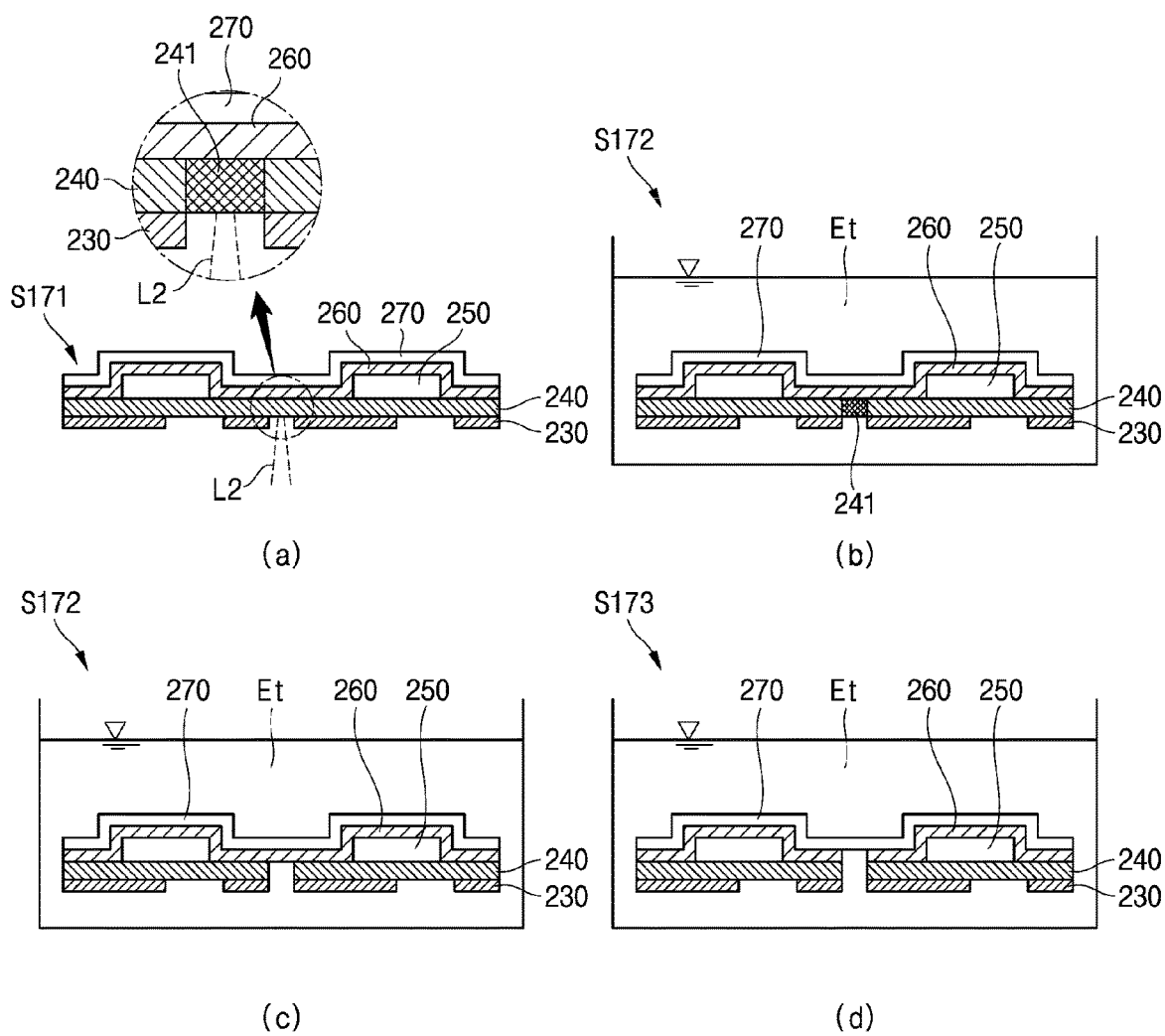
FIG. 5 is a flow diagram illustrating the method of manufacturing a flexible OLED module shown in FIG. 2.
Figure 6:
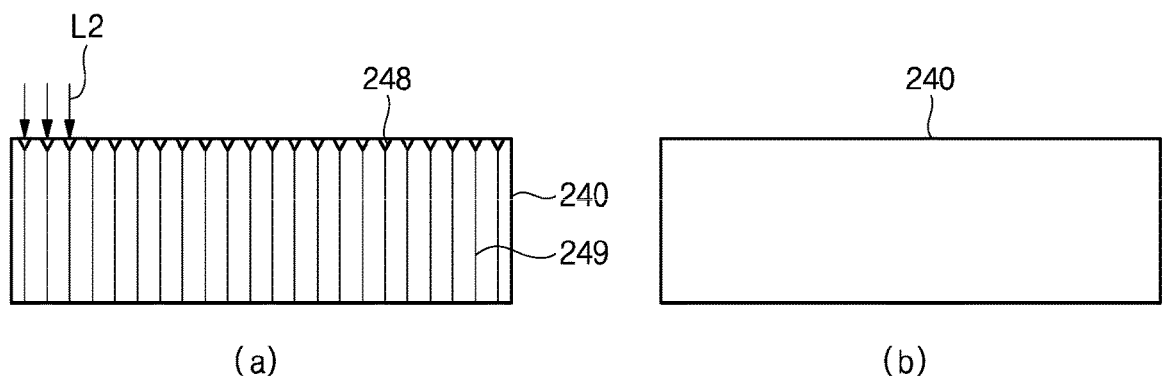
FIG. 6 is sectional views for comparison of a cut surface of a thin glass sheet according to the present invention with a cut surface of a typical thin glass sheet.
Figure 7:
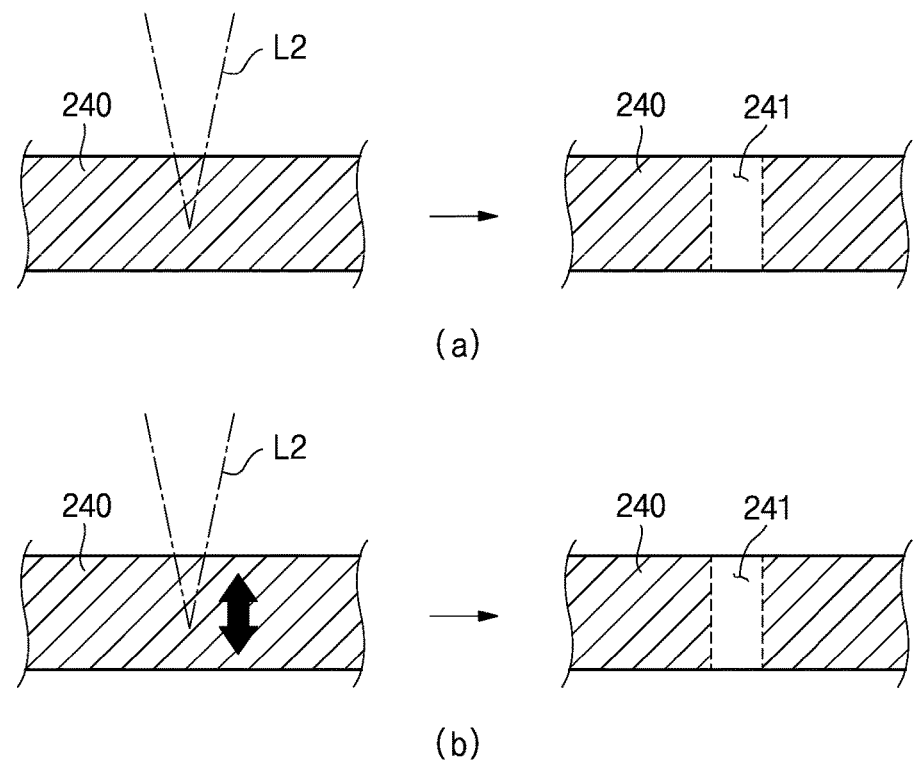
FIG. 7 is views illustrating a deformation line generation step of the method of manufacturing a flexible OLED module shown in FIG. 2.

FIG. 5 is a flow diagram illustrating the method of manufacturing a flexible OLED module shown in FIG. 2 and FIG. 6 is sectional views for comparison of a cut surface of a thin glass sheet according to the present invention with a cut surface of a typical thin glass sheet, in which FIG. 6 (a) is a sectional view of the cut surface of the thin glass sheet cut by conventional laser beam cutting and FIG. 6 (b) is a sectional view of the cut surface of the thin glass sheet cut by a cutting process according to the present invention. FIG. 7 is views illustrating a deformation line generation step of the method of manufacturing a flexible OLED module shown in FIG. 2.

Referring to FIG. 5 to FIG. 7 together with FIG. 1 and FIG. 2, the manufacturing method according to the present invention may further include an anti-etching layer formation step S160 after the protective layer formation step S150. In the anti-etching layer formation step S160, an anti-etching layer 270 may be formed on one surface of the protective layer 260.

Further, the singulation step S180 may include a deformation line generation step S171 and an etching step S172.

In the deformation line generation step S171, a glass deformation line 241 may be generated on the thin glass sheet 240 by irradiating a cutting-scheduled line 10 (see FIG. 3 (a) and FIG. 4) on the thin glass sheet 240 with an intensity of laser beams L2 not exceeding an ablation threshold of the thin glass sheet 240.

In the deformation line generation step S171, the laser beams L2 emitted to the thin glass sheet 240 may be ultra-short pulse laser beams including picosecond pulse laser beams or femtosecond pulse laser beams.

Since the picosecond pulse laser beams are emitted with picosecond pulse durations and the femtosecond pulse laser beams are emitted with femtosecond pulse durations, a fused layer is not formed outside an irradiated region and deformation of materials does not occur in surrounding regions upon irradiation of the thin glass sheet 240 with the laser beams. That is, upon irradiation with the picosecond pulse laser beams or the femtosecond pulse laser beams, thermal energy can be effectively transferred to an irradiated zone, thereby allowing glass deformation to be restricted to the cutting-schedule line 10 of the thin glass sheet 240.

When the cutting-schedule line 10 is irradiated with such laser beams L2, a portion of the cutting-scheduled line 10 irradiated with the laser beams L2 is changed from an alpha phase ($\alpha$ phase) to a beta phase ($\beta$ phase).

The glass deformation line 241 undergoes permanent physical and chemical structural deformation through a non-linear photoionization mechanism by the ultra-short pulse laser beams. A laser beam-focused region becomes a Si-enriched region and undergoes variation in index of refraction through densification.

The glass deformation line 241 deformed through focusing the ultra-short pulse laser beams thereon may be etched 20 to 300 times faster than a non-deformed region through reaction with an alkali or acidic chemical solution. The etching rate may be controlled by a number of variables, such as laser intensity, pulse duration, repetition rate, wavelength, focal length, scanning rate, chemical solution concentration, and the like.

Referring to FIG. 7 (a), the phase of the glass deformation line 241 may be changed from an upper surface of the thin glass sheet 240 to a lower surface thereof by focusing the laser beams L2 at a single focus on the thin glass sheet 240.

Referring again to FIG. 7 (b), the focus of the laser beams L2 may be consecutively moved from the upper surface of the thin glass sheet 240 to the lower surface thereof. That is, the thin glass sheet 240 may be irradiated with the laser beams L2 such that the focus of the laser beams L2 can be moved in the thickness direction of the thin glass sheet 240. As a result, the phase of the entire region of the glass deformation line 241 can be uniformly changed.

In the etching step S172, the thin glass sheet 240 and the protective layer 260 may be removed along the glass deformation line 241 by removing the glass deformation line 241 through etching with an etchant Et while allowing the protective layer 260 exposed through the removed glass deformation line 241 to be removed through etching with the etchant Et.

That is, in the etching step S172, when the thin glass sheet 240 is dipped in the etchant to allow the glass deformation line 241 to be removed through etching, the thin glass sheet 240 may be cut along the glass deformation line 241. Then, a portion of the protective layer 260 may be exposed through a cut portion of the thin glass sheet 240 and may be removed through etching with the etchant Et.

The etchant Et used in the etching step S172 may include a chemical etchant including fluoride (HF), nitric acid ($HNO_3$), potassium hydroxide (KOH), and the like.

The beta phase can react with the chemical etchant 100 or more times faster than the alpha phase. Accordingly, when the etchant Et is used after formation of the glass deformation line 241 having the beta phase, etching occurs only along the glass deformation line 241 to remove the glass deformation line 241, whereby the thin glass sheet 240 can be divided into multiple thin glass sheets 240.

As shown in FIG. 6 (a), in a typical cutting method using laser beams, the thin glass sheet 240 is irradiated with the laser beams L2 to form spots 248 corresponding to a cutting line and the thin glass sheet 240 is cut through propagation of cracks by reducing the temperature of the thin glass sheet 240 to connect the spots 248 to each other, thereby causing generation of crack marks 249 on the cut surface of the thin glass sheet 240. Accordingly, there is a need for an edge grinding process to remove such crack marks 249, causing increase in process time. Moreover, since it is difficult to apply the edge grinding process to an ultra-thin glass (UTG) substrate having a thickness of 100 μm or less, it is difficult to remove the crack marks. Moreover, chemical dissolution using a general photoresist has a problem of generating a severe taper angle at a cut portion.

However, according to the present invention, cutting is performed through etching after partial deformation of the thin glass sheet using ultra-short pulse laser beams so as to form the glass deformation line 241, thereby providing a cut surface having a cut angle approaching 0 degrees. In addition, the thin glass sheet 240 can have a clean cut surface free from crack marks. Furthermore, this process may be applied to the thin glass sheet 240, which is an ultra-thin glass (UTG) film having a thickness of 100 μm or less.

After the etching step S172 is finished, an anti-etching layer removal step S173 may be performed to remove the anti-etching layer 270 from the protective layer 260, thereby providing multiple unit OLED modules 200.

Although some embodiments have been described herein, it should be understood that these embodiments are provided for illustration only and are not to be construed in any way as limiting the present invention and that various modifications, changes, alterations, and equivalent embodiments can be made by those skilled in the art without departing from the spirit and scope of the invention. For example, components described as implemented separately may also be implemented in combined form, and vice versa.

It should be understood that the scope of the present invention is defined by the following claims and all changes or modifications derived from the meaning and scope of the claims and equivalents thereto should be construed as being within the scope of the present invention.

<Reference numerals>

| | |
|---|---|
| 10: Cutting-scheduled line | 11: Hole region |
| 200: Unit OLED module | 210: Base substrate |
| 220: Sacrificial layer | 230: Polymer layer |
| 240: Thin glass sheet | 241: Glass deformation line |
| 250: OLED element | 260: Protective layer |
| 270: Anti-etching layer | |

What is claimed is:

1. A method of manufacturing a flexible OLED module, comprising:
    a polymer layer formation step in which a polymer layer is formed on one surface of a base substrate;
    a glass sheet formation step in which a glass sheet is formed on one surface of the polymer layer;
    an OLED element formation step in which multiple OLED elements are formed on one surface of the glass sheet;
    a protective layer formation step in which a protective layer is formed on one surface of the glass sheet to cover the OLED elements;
    a separation step in which the base substrate is separated from the polymer layer by irradiating a boundary between the base substrate and the polymer layer with laser beams; and
    a singulation step in which the glass sheet and the protective layer are cut to provide multiple unit OLED modules each comprising the OLED element,
    wherein, in the polymer layer formation step, the polymer layer is formed in a region excluding a hole region corresponding to a hole for an electronic device to be assembled to the unit OLED modules.

2. The method according to claim 1, wherein, in the polymer layer formation step, the polymer layer is formed in a region excluding a cutting-scheduled line along which cutting will be performed in the singulation step.

3. A method of manufacturing a flexible OLED module, comprising:
    a polymer layer formation step in which a polymer layer is formed on one surface of a base substrate;
    a glass sheet formation step in which a glass sheet is formed on one surface of the polymer layer;
    an OLED element formation step in which multiple OLED elements are formed on one surface of the glass sheet;
    a protective layer formation step in which a protective layer is formed on one surface of the glass sheet to cover the OLED elements;
    a separation step in which the base substrate is separated from the polymer layer by irradiating a boundary between the base substrate and the polymer layer with laser beams; and
    a singulation step in which the glass sheet and the protective layer are cut to provide multiple unit OLED modules each comprising the OLED element; and
    an anti-etching layer formation step in which an anti-etching layer is formed on one surface of the protective layer, after the protective layer formation step,
    wherein the singulation step comprises:
    a deformation line generation step in which a glass deformation line is generated on the glass sheet by irradiating a cutting-scheduled line on the glass sheet with an intensity of laser beams not exceeding an ablation threshold of the glass sheet; and
    an etching step in which the glass sheet and the protective layer are removed along the glass deformation line by removing the glass deformation line through etching with an etchant while allowing the protective layer exposed through the removed glass deformation line to be removed through etching with the etchant.

4. The method according to claim 3, wherein, in the deformation line generation step, a phase of the glass deformation line is changed by irradiating the cutting-scheduled line with the laser beams from one surface of the glass sheet to the other surface thereof while focusing the laser beams at a single focus on the glass sheet.

5. The method according to claim 3, wherein, in the deformation line generation step, a phase of the glass deformation line is changed by irradiating the cutting-scheduled line with the laser beams from one surface of the glass sheet to the other surface thereof while consecutively moving a focus of the laser beams.

6. The method according to claim 1, wherein the glass sheet has a thickness of greater than 0 μm to 100 μm.

7. The method according to claim 1, further comprising:
a sacrificial layer formation step in which a sacrificial layer is formed on one surface of the base substrate such that the polymer layer is formed on one surface of the sacrificial layer, before the polymer layer formation step,
wherein, in the separation step, the base substrate is separated from the polymer layer through separation of the sacrificial layer by laser lift-off (LLO).

\* \* \* \* \*